United States Patent
Ikegami

(10) Patent No.: US 6,500,745 B1
(45) Date of Patent: Dec. 31, 2002

(54) METHOD FOR MANUFACTURING SIDEWALL SPACERS OF A SEMICONDUCTOR DEVICE WITH HIGH ETCH SELECTIVITY AND MINIMIZED SHAVING

(75) Inventor: Naokatsu Ikegami, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/978,052

(22) Filed: Oct. 17, 2001

(30) Foreign Application Priority Data

Dec. 8, 2000 (JP) .......................... 2000-373970
May 23, 2001 (JP) .......................... 2001-153871

(51) Int. Cl.$^7$ ................. H01L 21/3205; H01L 21/4763
(52) U.S. Cl. ................... 438/595; 438/723; 438/724; 438/734; 438/714
(58) Field of Search ................... 438/595, 714, 438/723, 724, 734, 585

(56) References Cited

U.S. PATENT DOCUMENTS

| | | | | |
|---|---|---|---|---|
| 5,296,094 A | * | 3/1994 | Shan et al. .................. | 438/714 |
| 5,759,920 A | * | 6/1998 | Burns et al. .................. | 216/62 |
| 6,017,823 A | * | 1/2000 | Shishiguchi et al. ........ | 438/230 |
| 6,051,863 A | * | 4/2000 | Hause et al. .................. | 257/283 |
| 6,180,535 B1 | * | 1/2001 | Wu et al. ...................... | 216/79 |
| 6,207,544 B1 | * | 3/2001 | Nguyen et al. ............. | 438/595 |
| 6,225,203 B1 | * | 5/2001 | Liu et al. ..................... | 438/199 |
| 6,291,354 B1 | * | 9/2001 | Hsiao et al. ................. | 438/305 |

OTHER PUBLICATIONS

Takamiya et al., "Deep–Bu0.1um MOSFET's with Very Thin SOI Layer for Ultra–Low Power Applications," The Institutes of Electronics, Information and Communication Engineers, CII, vol. J81–cII No. 3, (Mar. 1998).

Su et al., "Optimization of Series Resistance in Sub–0.2 um SOI MOSFET's," IEEE Electron Device Letters, vol. 15, No. 9, Sep. 1994, pp. 363–365.

* cited by examiner

Primary Examiner—John F. Niebling
Assistant Examiner—Angel Roman
(74) Attorney, Agent, or Firm—Volentine Francos, PLLC

(57) ABSTRACT

A method for manufacturing a field effect transistor includes a first step for etching 70%~90% of the thickness of an insulating film ($SiO_2$ or $Si_3N_4$) formed covering a gate electrode formed on a silicon semiconductor substrate; and a second step for etching a remaining insulating film to remove an unnecessary portion, other than sidewall spacers, of the remaining insulating film. The two etching steps are respectively for the purpose of vertical processing of the sidewall spacers formed on each side of the gate electrode and securing a high etch selectivity ratio of the insulating film to the silicon substrate.

22 Claims, 9 Drawing Sheets

METHOD FOR MANUFACTURING SIDEWALL SPACERS OF A SEMICONDUCTOR DEVICE WITH HIGH ETCH SELECTIVITY AND MINIMIZED SHAVING

FIELD OF THE INVENTION

The present invention relates to a method for manufacturing a semiconductor device, and more particularly to a method for manufacturing a semiconductor device having sidewall spacers made of an insulating material, which are used at sidewalls of a gate electrode.

RELATED ART

With the advancement in performance of semiconductor devices centered on system LSIs and logic LSIs in recent years, there has evolved a technology of forming a field effect transistor (FET) on a semiconductor substrate of SOI (Silicon on Insulator) structure instead of the conventional bulk Si substrate. This is a method for forming an FET on a thin silicon substrate called the SOI layer on an insulating layer ($SiO_2$) formed on a silicon substrate, for example. This method is superior in that junction capacitors are smaller than in the conventional method using a bulk substrate, so that the transistor operation can be made faster and transistors can be isolated more easily. Above all, a fully depleted-mode FET formed on the above-mentioned SOI layer, having a smaller parasite capacitor and a smaller sub-threshold swing (current Id rises at steep gradient) than in the bulk Si substrate, is drawing attention as a device with low power consumption. Further, because the width of a channel depletion layer is decided by the thickness of the SOI layer, this fully depleted-mode FET is effective in uppressing the short channel effect.

To realize a fully-depleted-mode operation of an SOI device having those merits, it is necessary to make the SOI layer thinner as miniaturization of devices progresses. As shown in IEICE (Institute of Electronics, Information and communication Engineers) papers, C-11 vol. J81-C-11, No. 3, pp. 313–319 (1998), as the gate length was scaled down to 0.35 µm, 0.25 µm and 0.18 µm, the thickness of SOI layers is reduced to about 60 nm, 50 nm and 40 nm. In SOI devices of a generation with a gate length of 0.1 µm it is believed that the thickness of the SOI layer is required to be less than 20 nm, and a progressive thinning is expected to continue.

As the parasitic resistances of the source and drain diffused layers in the SOI layer increase due to a progressive thinning of the SOI layer, the current drive capability of the transistor notably decreases. To preclude this problem, attempts have been made to decrease the resistances of the source and drain regions generally by a method of forming silicide, such as TiSix or CoSix, on the diffused layers. Regarding a method of using CoSix, for example, there has been a report, in which in order for a $CoSi_2$ phase with the lowest resistance, out of three reaction products of $Co_2Si$, CoSi and $CoSi_2$, to be formed selectively at desired parts on both sides of a gate electrode on the SOI layer, a $CoSi_2$ silicide can be formed stably by depositing Co with an optimum thickness on the SOI layer by sputtering, and then performing a thermal reaction process (RTA) in two stages consisting of a first RTA process (550° C. for 30 seconds) and a second RTA (700° C. for 60 seconds), for example (IEEE Electron Device Letters, Vol. 15, No. 9 (1994)).

However, miniaturization has come to be restricted by the fact that as the SOI layer is made thinner, a not enough amount of Si is left, which is to be consumed by reaction with Co. Moreover, the SOI layer is reduced in thickness as it goes through various processes until suicide is formed, and as devices are reduced in size and the SOI layer becomes thinner, the effects of the above-mentioned problems has come to be not negligible.

The progressive thinning of the SOI layer during the production process makes it difficult to form a suicide layer in a stable manner, and sometimes gives rises to defects consisting of voids. After an interlayer insulating film has been deposited, in a process of forming a contact hole through the interlayer insulating film, if a contact hole opens to that portion of the suicide layer which has the voids mentioned above, because, in this case, the contact hole is virtually continuous through the voids of the interlayer insulating film to a BOX (Buried Oxide) layer as an insulating layer under the SOI layer, a conducting metal that fills up the contact hole often penetrates the BOX layer, resulting in a considerable decrease in yield in the fabrication of devices. Therefore, it is an extremely important in the development of miniaturized SOI devices to minimize shaving of the SOI layer. In this specification, that yield which is affected by penetration of the BOX layer is called "BOX-related yield."

One reason for a decrease in the thickness of the SOI layer, which has serious adverse effects, is shaving that occurs in etching sidewall spacers used for the single-drain or the LLD transistor structure, above all else. There has been demand for a technology for forming sidewall spacers with high insulating film/silicon selectivity by such a method as to reduce shaving almost to zero in the production of semiconductor devices.

The present invention has been made with the above problem in the conventional production method of a field effect transistor in mind and has as a first object to provide newfangled and improved production method and etching method of a field effect transistor, which are capable of forming sidewall spacers for the gate electrode of an SOI device under an etching condition of extremely high etch selectivity compared with prior art and minimizing an amount of shaving of the SOI layer.

A second object of the present invention is to provide newfangled and improved production method and etching method of a field effect transistor, which are capable of forming sidewall spacers for the gate electrode of an SOI device under an etching condition of extremely high etch selectivity compared with prior art and minimizing an amount of shaving of the SOI layer, to thereby achieve a stable high current drive capability of the transistor.

A third object of the present invention is to provide newfangled and improved production method and etching method of a field effect transistor, which are capable of forming sidewall spacers for the gate electrode of a SOI device under an etching condition of extremely high etch selectivity compared with prior art and minimizing an amount of shaving of the SOI layer, to thereby realize a high yield.

A fourth object of the present invention is to provide a newfangled and improved manufacturing method of a semiconductor device having a gate on a semiconductor substrate, which is capable of suitably forming sidewall spacers for the gate.

SUMMARY

According to a first aspect of the present invention, there is provided a method for manufacturing a semiconductor device that comprises forming a ate electrode on a semiconductor substrate including silicon; forming an insulating film on the semiconductor substrate and the gate electrode; performing a first etching process to remove the insulating film in an amount corresponding to 70%~90% of the thickness of the insulating film by anisotropic etching to the insulating film; and performing a second etching process to etch the remaining portion of the insulating film under a condition of higher insulating film/silicon selectivity than insulating film/silicon selectivity in the anisotropic etching.

In the foregoing, a preferable mode is one wherein the insulating film is a silicon oxide film.

Also, a preferable mode is one wherein the second etching step is carried out under a condition of silicon oxide/silicon etch selectivity of not less than 500.

Further, a preferable mode is one where the first etching step is carried out using a mixed gas of $C_4F_8$ and Ar as a process gas under a condition of a ratio of Ar gas flow rate to a total gas flow rate is not less than 90%.

Further, a preferable mode is one wherein the first etching step is carried out using a mixed gas including $O_2$ as a process gas.

Additionally, a preferable mode is one wherein the above-mentioned mixed gas including $O_2$ is one of a mixed gas of $C_4F_8$, $O_2$ and Ar, a mixed gas of $CHF_3$, $O_2$ and Ar, a mixed gas of $CHF_3$, $CF_4$, $O_2$ and Ar, and a mixed gas of $CF_4$, $O_2$ and Ar.

Further, a preferable mode is one wherein the first etching step and the second etching step are carried out in the same etching equipment.

Further, a preferable mode is one wherein the second etching step is carried out using a mixed gas of $CHF_3$ and CO, keeping a total gas flow rate of not less than 300 sccm, and maintaining a total gas pressure at not less than 60 mTorr.

Further, a preferable mode is one wherein the insulating film is a silicon nitride.

Also, a preferable mode is one wherein the second etching step is carried out under a condition of silicon nitride/silicon etch selectivity of not less than 500.

Further, a preferable mode is one wherein the second etching step is carried out using a mixed gas of $CHF_3$, $CH_2F_2$, and CO, keeping a pressure of not less than 20 mTorr and not more than 30 mTorr and under a condition of a mixing ratio of $CH_2F_2$ to a mixed gas of $CHF_3$ and $CH_2F_2$, is not less than 30%.

Further, a preferable mode is one wherein the first etching step is carried out using a mixed gas including $O_2$ as a process gas.

Further, a preferable mode is one wherein the semiconductor substrate is a semiconductor substrate having an insulating layer and a silicon layer formed on the insulating layer, and wherein the gate electrode is formed on the silicon layer.

According to a second aspect of the present invention, there is provided a method for manufacturing a semiconductor device that comprises forming a gate electrode on a semiconductor substrate having a silicon layer on a surface thereof; forming an insulating film on the semiconductor substrate and the gate electrode; performing a first etching process to remove the insulating film in an amount corresponding to 70%~90% of the thickness of the insulating film by anisotropic etching to the insulating film; and performing a second etching process to etch the remaining portion of the insulating film to remove an unnecessary portion other than sidewall spacers covering both sides of the gate electrode under a condition of higher insulating film/silicon selectivity than insulating film/silicon selectivity in the anisotropic etching.

BRIEF DESCRIPTION OF THE DRAWINGS

FIG. 6(a) is a sectional view showing the shape of the insulating film before the first etching step of the FET; FIG. 6(b) is a sectional view showing the shape of the insulating film after the first etching step; and FIG. 6(c) is a sectional view showing the shape of the insulating film (sidewall spacers) after the second etching step;

FIG. 10(a) is a sectional view showing the shape of the insulating film before the first etching step of an FET; FIG. 10(b) is a sectional view showing the shape of the insulating film after the first etching step; and FIG. 10(c) is a sectional view showing the shape. of he insulating film (sidewall spacers) after the second etching step.

DESCRIPTION OF THE PREFERRED EMBODIMENTS

Referring to the accompanying drawings, detailed description will be made of preferred embodiments of a manufacturing method and an etching method of a field effect transistor according to the present invention. In this specification and drawings, components having substantially the same functions are designated by the same numerals, and their repetitive descriptions are omitted.

First Embodiment

As an example of the first embodiment, a case will be described in which an etching method using extremely high insulating film/silicon selectivity compared with prior art, which can minimize an amount of shaving of the SOI layer, has been applied to the formation of sidewall spacers. The inventor made assiduous efforts to search for ratios between the etch rate of insulating film and the etch rate of silicon, in other words, etching conditions with extremely high insulating film/silicon selectivity such that the amount of shaving of the SOI layer is reduced to a minimum (substantially to zero) in the formation of sidewall spacers. Eventually, the inventor found out practical process conditions which make it possible to attain high insulating film/silicon selectivity of as high as about 500, which had been considered extremely difficult. The process will be described in the following.

(Dipole Ring Type Magnetron RIE Unit 1)

Figure 1:
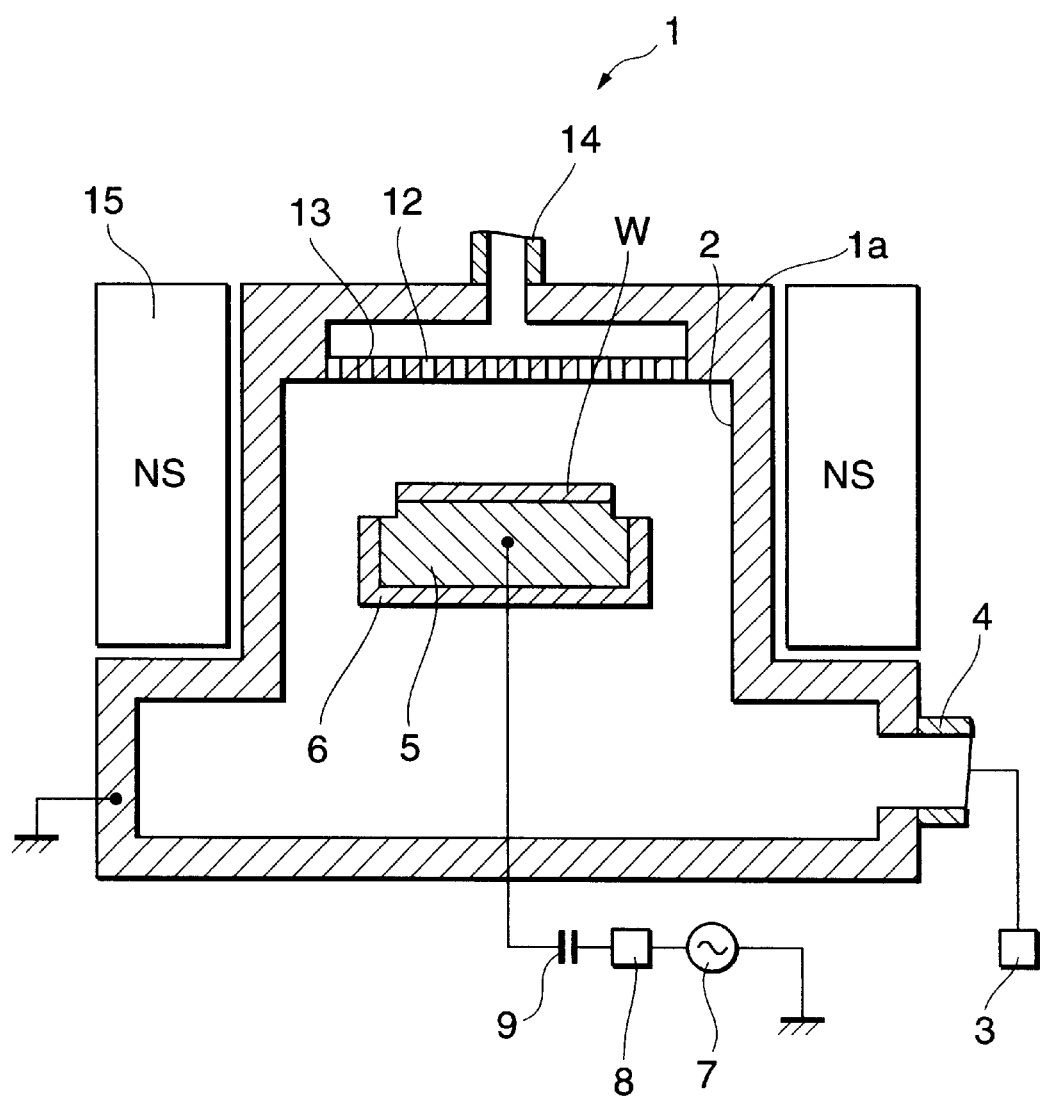
FIG. 1 is a sectional view schematically showing a dipole ring type magnetron RIE unit according to the present invention.

As an example of equipment used in this embodiment, description will be made of a dipole ring type magnetron RIE (Reactive Ion Etching) equipment with reference to FIG. 1.

A dipole ring type magnetron RIE unit 1 includes a reaction chamber 2 defined by an airtight vessel 1a, which is electrically connected to ground. The reaction chamber 2 is connected at its bottom with an exhaust pipe 4, which leads to a vacuum pump 3. The reaction chamber 2 is so structured as to draw a vacuum evenly along the peripheral area of the bottom, so that the interior of the reaction chamber 2 can be set and maintained at a desired pressure.

In the center of the reaction chamber 2, there are provided a lower electrode 5 and a support base 6. The lower electrode 5 is supplied, through a matching circuit 8 and a blocking capacitor 9, with high-frequency power from a high frequency power supply 7, which is provided outside the reaction chamber 2.

Figure 2:
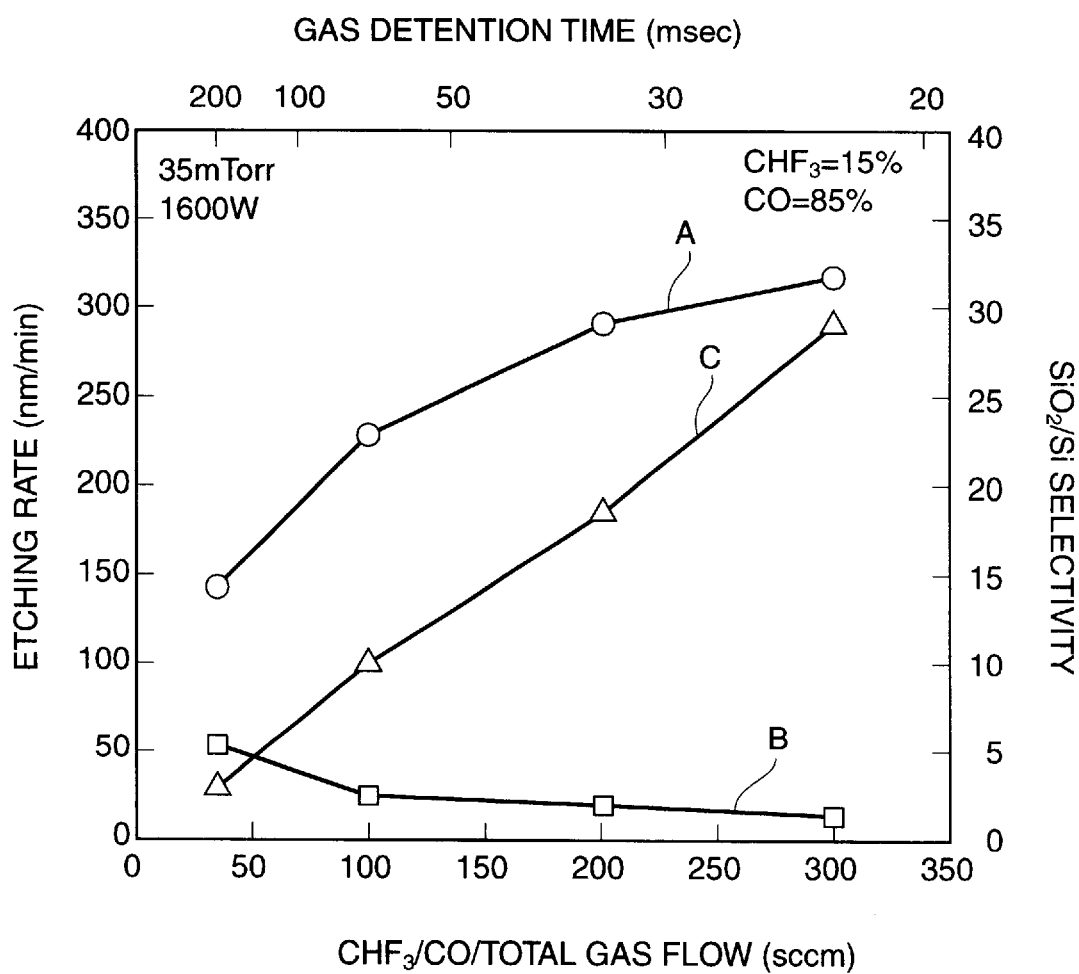
FIG. 2 is a graph showing relations of the etching rates of $SiO_2$ and Si and the $SiO_2$/Si selectivity with respect to etching gas flow rates according to the present invention.

An upper electrode 12 is provided at an upper position of the reaction chamber 2. A number of gas diffusion holes 13 are bored at that surface of the upper electrode which faces a semiconductor wafer W on the lower electrode 5. A process gas (etching gas) supplied from a gas inlet port 14 at the top of the upper electrode 12 is spewed out from the multiple gas diffusion holes 13 toward the semiconductor wafer W Permanent magnets 15 are disposed close to the side faces of the reaction chamber 2. The permanent magnets 12 are arranged so as to rotate about the gas inlet port 14 as the rotating axis at a desired rotating speed driven by a driven mechanism (not shown), such as a motor. The permanent magnets 15 form uniform parallel magnetic fields with respect to the surface of the semiconductor wafer W. FIG. 2 shows changes in the etching rate and changes in the $SiO_2$/Si selectivity with respect to a total gas flow rate, that is, a mixed gas flow rate when an $SiO_2$ film and an Si layer were etched using a mixed gas of $CHF_3$/CO (mixing ratio=15%/85%) in the above-mentioned dipole ring type magnetron RIE unit 1.

In the graph of FIG. 2, the horizontal axis represents the mixed gas flow rates (sccm). The vertical axis on the left side represents etching rates (nm/min), and the vertical axis on the right side represents ratios between the etching rate of the $SiO_2$ film and the etching rate of the Si, in other words, $SiO_2$/Si selectivity.

The characteristic curve A in the graph shows changes in the etching rate of the silicon dioxide ($SiO_2$) film when the mixed gas flow rate was varied, the characteristic curve B shows changes in the etching rate of silicon (Si) when the mixed gas flow rate was varied, and the characteristic curve C shows changes in the above-mentioned selectivity when the mixed gas flow rate was varied.

Note that the pressure and RF power were fixed at 35 mTorr and 1600 W, respectively.

Figure 3:
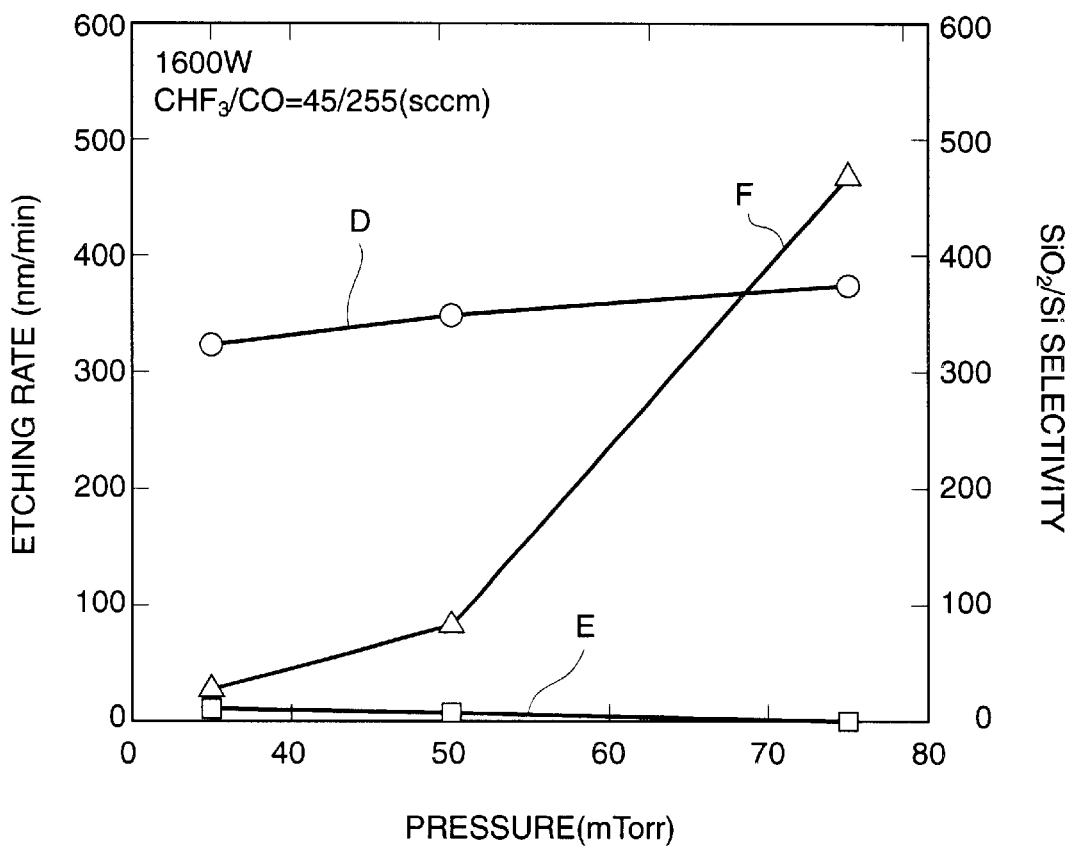
FIG. 3 is a graph showing relations of the etching rates of $SiO_2$ and Si and the $SiO_2$/Si selectivity with respect to the total pressure according to the present invention.

FIG. 3 is a graph showing a relation of changes in the above-mentioned selectivity with respect to changes in the chamber internal pressure where the RF power and the $CHF_3$/CO gas flow rates were fixed at 1600 W and 45 sccm/255 sccm.

In the graph of FIG. 3, the horizontal axis represents the gas pressure of the mixed gas in the reaction chamber (mTorr). The vertical axis on the left side represents the etching rates (nm/min) as in the graph in FIG. 2, and the vertical axis on the right side represents the $SiO_2$/Si selectivity as in FIG. 2.

In FIG. 3, the characteristic curve D shows changes in the etching rate of the silicon dioxide ($SuO_2$) film when the mixed gas pressure in the reaction chamber, the characteristic E shows changes in the etching rate of silicon (Si) when the mixed gas pressure in the reaction chamber was varied, and the characteristic curve F shows changes in the etch selectivity when the mixed gas pressure in the reaction chamber was varied.

As is clear from FIGS. 2 and 3, as the mixed gas flow rate, i.e., the total gas flow rate rises, in other words, as the gas detention time becomes shorter (see FIG. 2), and also as the total gas pressure, i.e., the mixed gas pressure rises (see FIG. 3), the $SiO_2$/Si selectivity increases. As shown in FIG. 3, under the conditions that the RF power is fixed at 1600 W, that the $CHF_3$/CO flow rates are high at 45 sccm/255 sccm, respectively, and that the gas pressure is high at 70 mTorr, ultra-high etch selectivity of about 500—far higher than in prior art could be attained. It ought to be noted that sufficiently practical ultra-high selectivity close to 500 can be achieved under a high pressure of 60 mTorr (65 mTorr for example).

Under the condition of sufficiently practical selectivity of about 500 as mentioned above, a practical value of 380 nm/min was achieved securely as an etch rate of an $SiO_2$ film. In over-etching, that is, in etching about 30% longer than a calculated required etching time to remove the $SiO_2$ film on silicon, the amount of shaving of silicon beneath the $SiO_2$ film could be reduced to substantially zero. When this condition was applied to an etching step to form sidewall spacers in a real 0.15 μm-SOI device (SOI film thickness of 35 nm), the amount of shaving at a flat portion of the SOI layer was approximately zero.

As has been described, according to this embodiment, the amount of shaving of the SOI layer in the formation of a semiconductor device can be reduced to substantially zero, a fact which is very useful for development of microminiaturized SOI devices.

The above-mentioned first embodiment, which is capable of substantially minimizing the shaving of the SOI layer resulting from the formation of a semiconductor device, is very useful for development of SOI microchips.

Second Embodiment

In the second embodiment, description will be made of a case where the etching conditions discussed in the first embodiment were applied to the formation of sidewall spacers of a MOS transistor.

If the etching conditions discussed in the first embodiment are applied just as they are to the formation of sidewall spacers of a MOS transistor, a current value may greatly vary in a single-drain transistor, above all else.

Figure 4:
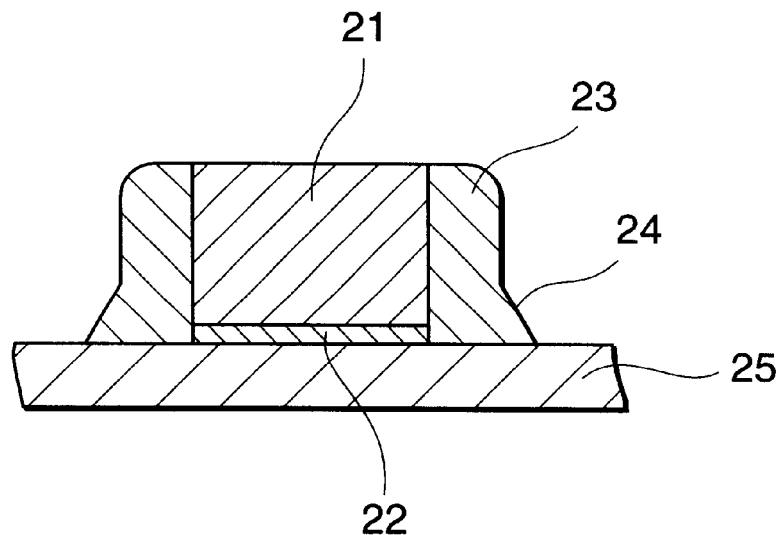
FIG. 4 is a sectional view showing the shape of an FET structure when sidewall spacers were formed by a single etching step under a condition of high insulating film/silicon selectivity.

The inventor, under a transmission electron microscope, analyzed in detail the shape of sidewall spacers after etching to investigate factors giving rise to a fluctuation of the current value, particularly, in a single-drain transistor under etching conditions for forming sidewall spacers, including etch selectivity of about 500 as mentioned above, which is extremely high as compared with prior art. FIG. 4 is an explanatory diagram showing the sidewall spacers formed on the sidewalls of a gate (gate electrode 21, gate oxide film 22) on a SOI substrate 25 having a SOI structure. As shown in FIG. 4, it was revealed that the sidewalls had been tapered (formed with a tail) at lower portions thereof (tapered part 24).

This is considered because a $CHF_3/CO$ gas with a high deposit property was used as an etching gas for forming sidewall spacers with the intention of attaining ultra-high etch selectivity, a polymerized film of CF system was deposited in a thick layer at the bottom portion of the sidewalls of the gate (21, 22) and the polymerized film served as the mask for the sidewalls while etching was taking place. The deposit rate of the polymerized film at the sidewalls is very sensitive to changes in process parameters, such as pressure and temperature. Therefore, if those process parameters vary in the interior of a wafer, for example, they are directly conducive to a variation of the taper angle of the tail.

Particularly for a single-drain transistor, the width dimension of sidewall spacers is a very important parameter in deciding a concentration profile of impurity ions when the ions are injected diagonally. Therefore, on each side of the gate electrode, by presence of the tail, the sidewall width is made effectively wider than the vertical sidewall spacer by the amount of the tail width. Consequently, when there is a small change in the taper angle of the tail of the sidewall spacer, the implanted dopant concentration profile changes easily, resulting in a variation of a current value of the transistor. It was revealed that if the taper angle varies in a direction in which the taper width becomes wider, there is a possibility that an effective sidewall width falls far short of a target value, impurity ions cannot be introduced close to below the gate electrode, and the current value is off a target value. Thus, a conclusion was reached that it is essential to make vertical the walls of the sidewall spacers by removing the tails to stabilize the transistor operation.

The inventor conducted etching experiments to form sidewall spacers by using various types of fluorocarbon plasma, and investigated in detail the relation between silicon oxide/silicon selectivity and the shape of sidewall spacers, and found out that there is a trade-off relation between realization of high etch selectivity and realization of vertical walls in sidewall spacers and that even if ultra-high selectivity of about 500 mentioned above could only be realized, it is virtually impossible to realize vertical sidewall spacers simultaneously with this high selectivity. This is considered chiefly due to a fact that a method was used by which to selectively deposit in a great thickness on silicon a fluorocarbon polymerized film as means to achieve high etch selectivity. In other words, this is because a thick polymerized film, which was responsible for the formation of tails, was also deposited on the walls of the sidewall spacers.

Figure 5:
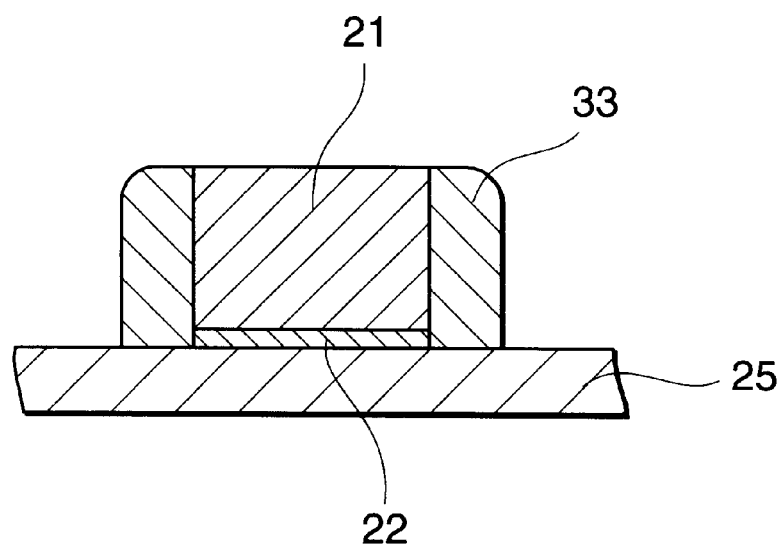
FIG. 5 is a sectional view showing an FET structure according to a second embodiment of the present invention.

However, by using a novel method to be described below, it has become possible to simultaneously achieve the prevention of shaving of Si as in the SOI layer and the formation of vertical sidewall spacers. According to this method, it is possible to form vertical sidewall spacers without tails as shown in FIG. 5 and without incurring shaving of Si. When this process was applied to an actual SOI device, remarkable improvements were made to the problems of a transistor's operation instability and the offset current mentioned above.

Description will be made of an etching process that simultaneously realizes ultra-high insulating film/silicon selectivity and vertical sidewall spacers.

As described above, in the range of experiments by the inventor, it has been clarified that whatever kind of fluorocarbon plasma was used, there was a trade-off relation between vertical sidewall spacers and high silicon-oxide insulating film/silicon etch selectivity. While thinking how to solve this problem, the inventor hit on an idea of abandoning the conventional use of a single etching process, dividing the etching process into two steps, and assigning (I) vertical processing of sidewall spacers to one step and (II) securing high insulating film/silicon selectivity to the other step.

The inventor looked into the relation between the shape of sidewall spacers and the ratio of amounts etched away in steps (I) and (II) out of the total thickness of the insulating film as the material subjected to etching, and found out that in the range of experiments the inventor conducted, when the ratio of the amount etched away in step (II) using a high etch selectivity exceeds 30% of the total thickness of the film being etched, the sidewall spacers come to be formed with a tail. More specifically, it has been clarified that ultra-high etch selectivity can be secured and vertical sidewall spacers can be obtained by setting the amount to be etched away in step (I) to 70% to about 90% (preferably about 90%) and the amount to be etched away in step (2) to 30% to about 10% (preferably about 10%). Referring to FIG. 6, an embodied method will be described in the following.

Figure 6A:
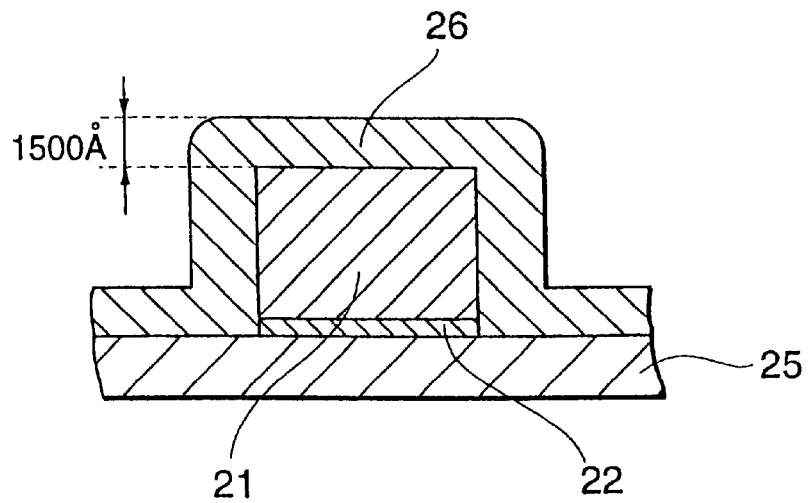
FIGS. 6(a) to 6(c) are sectional views showing production steps of an FET according to the second embodiment of the present invention.
Figure 6B:
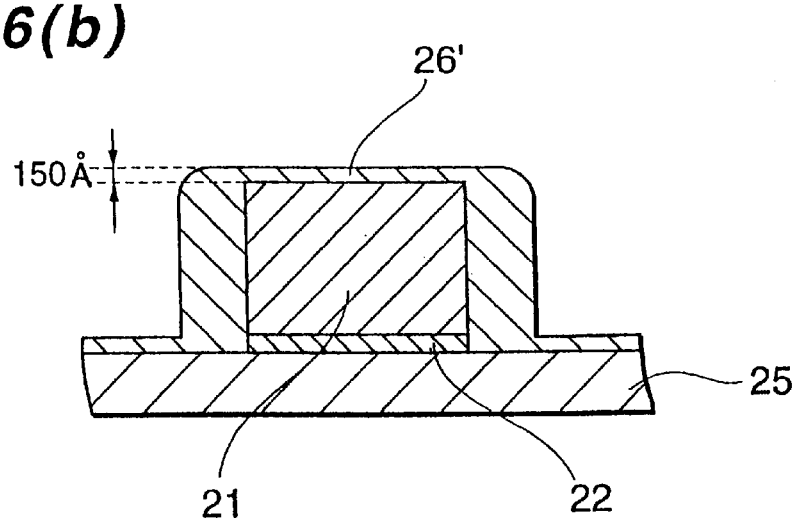

An $SiO_2$ film 26 as an insulating film was deposited to a thickness of 1500 Å by CVD (Chemical Vapor Deposition) on a 200 nm-thick gate (22 and 21) formed by a gate oxide film 22 and a gate electrode 21 formed on the gate oxide film as shown in FIG. 6(a). Then, in step (I), the $SiO_2$ was etched to remove as much as 1350 Å corresponding to 70%–90% or preferably 90% of the total thickness in a dipole ring type magnetron RIE unit by using a mixed gas of $C_4F_8/Ar$ (their gas flow rates being 20 sccm/500 sccm, respectively) under etching conditions of a reaction chamber pressure of 40 mTorr and an RF power of 800 W (FIG. 6(b)). Note that the flow rate values of 20 sccm/500 sccm for $C_4F_8/Ar$ components of a mixed gas are only for showing an example and may be other values so long as the Ar gas flow rate to the total flow rate is not less than 90%.

Figure 6C:
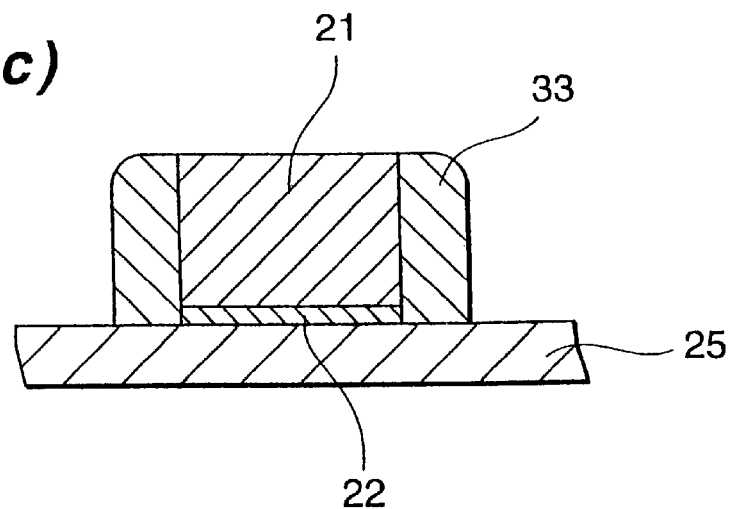

In step (II), the remaining $SiO_2$ film 26' with a thickness of 150 Å (10% of the total thickness of the insulating film) was etched with high etch selectivity in the same reaction chamber of the equipment to remove unnecessary portions of the remaining $SiO_2$ film 26' except for the sidewall spacers (33) covering both sides of the gate (21 and 22) (FIG. 6(C)). To show an example, the etching conditions for obtaining high etch selectivity are high flow rates and high pressure, more specifically, gas flow rates of $CHF_3/CO$ components of a mixed gas are 45 sccm/255 sccm and a chamber pressure is 70 mTorr, plus an RF power of 1600 W. Under these conditions, an etching process that exhibits insulating film/silicon selectivity of about 500 can be realized. The amount to be etched away in step (II) is low at not more than 150Å and etching time is short (a few seconds), and therefore tail-forming effects due to the deposition of a polymerized film at the walls of the sidewall spacers are negligible.

As described above, according to this second embodiment, the etching process of the sidewall spacers was divided into two steps, and two steps were respectively assigned different jobs: (I) vertical processing of the sidewall spacers and (II) securing insulating film/silicon selectivity. Therefore, it becomes possible to simultaneously achieve high insulating film/silicon selectivity and vertical processing of sidewall spacers, which have been in a trade-off relation. By applying this technology to SOI devices, the stability of operation of single-drain transistors, above all else, has been remarkably improved.

According to the second embodiment, it is possible to adopt an FET structure having vertical sidewall spacers 33 and the SOI layer (Si) free from shaving. This means that it has become possible to solve the operation instability particularly in a single-drain transistor, which is attributable to shaving of the SOI layer (Si) in prior art, and thereby obtain stable operation of FETs.

Third Embodiment

A third embodiment has been devised to solve a problem that effects of the second embodiment could not be obtained under a specific etching condition, and is characterized by addition of $O_2$ gas to the etching gas, which is a reaction gas, as an essential condition for the first etching step.

In the second embodiment, it has been disclosed that the etching process of the sidewall spacers was divided into two steps so that high insulating film/silicon selectivity and vertical processing of sidewall spacers could be achieved at the same time. However, it was found from experiments that when a specific etching condition is used in the first step, even if the etching process is divided into two steps, the sidewall spacers in a vertical shape can not sometimes be obtained. For example, when $CHF_3/Ar$ or $CHF_3/CF_4/Ar$, for example, was used as an etching gas, in other words, a reaction gas in the first step, even if the above-mentioned 2-step process was employed, the sidewall spacers came to be formed with a tail. This is considered because an unnecessary deposit effect was promoted on the sidewalls of the gate (21 and 22) in the first step, which was intended only for vertical processing.

The inventor further investigated changes in the sidewall spacers by using various kinds of gas in the first step with the conditions of the second etching step fixed. As a result, it has been found that making vertical the shape of sidewall spacers can be achieved by adding $O_2$ gas whatever gas may be used as an etching gas in the first etching step. The vertical processing can be achieved by using, for example, a mixed gas of $C_4F_8/O_2/Ar$ (their flow rates being 20 sccm/10 sccm/500 sccm, for example) obtained by adding $O_2$ to the $C_4F_8/Ar$ in the second embodiment as an etching gas in the first etching step, or by using a mixed gas of $CHF_3/O_2/Ar$, $CHF_3/CF_4/O_2/Ar$ or $CF_4/O_2/Ar$.

As has been described, in the third embodiment, by dividing the etching process of sidewall spacers into two steps and adding $O_2$ in the first step, the problem that the sidewall spacers cannot be made vertical in shape, even if the etching process is divided into two, could be solved. Thus, it has become possible to simultaneously achieve both high insulating film/silicon selectivity and vertical processing of the sidewall spacers. By applying this technology to SOI devices, a remarkable improvement becomes possible in securing the stability of the operation of transistors of single-drain, above all else.

Fourth Embodiment

This fourth embodiment has been devised to improve the yield of BOX layer mentioned above.

In the second and third embodiments, description has been made of an FET structure and its manufacturing method to solve the problem that the operation of a transistor of single-drain, above all else, becomes unstable when the sidewalls are formed under an ultra-high etching condition. It has also been shown that by using a newly developed sidewall forming process, the amount of shaving of the SOI layer can be minimized and a necessary minimum amount of the SOI layer can be secured for subsequent processing.

By securing a remaining thickness for the SOI layer, after the sidewall spacers have been formed, it is possible to selectively form stable $CoSi_2$ silicide to thereby improve the current drive capability of the transistor.

In the fourth embodiment, description will be made of a method for manufacturing a semiconductor device capable. of making remarkable improvements to the unelevated yield of the above-mentioned BOX layers related to the contact hole in the forming process of contact holes that are open to the Co silicide, which has been formed previously.

Figure 7:
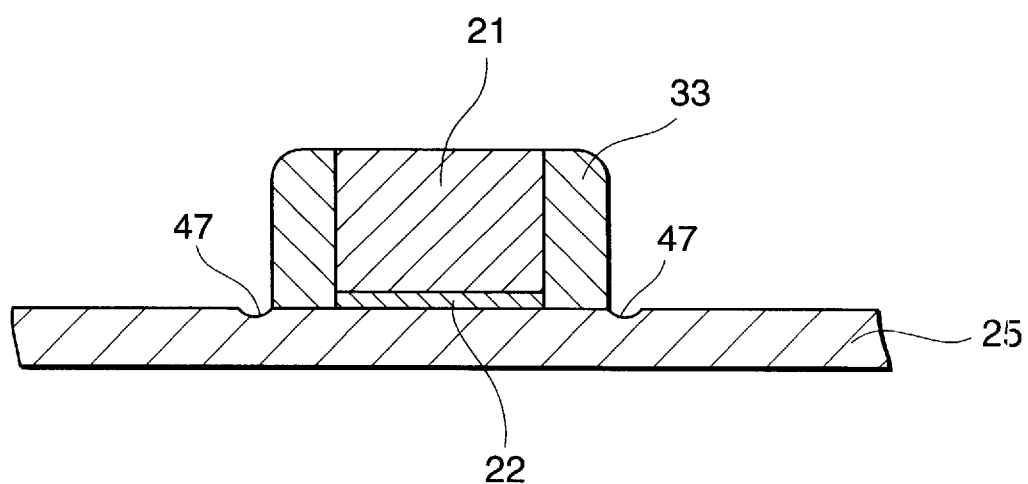
FIG. 7 is a sectional view showing local subtrenches or trenching of Si formed at the ends of the sidewall spacers by vertical processing under an etching condition of high insulating layer/silicon selectivity.

To clarify factors attributable to the unfavorable yield of the Box layer, which would exist at the bottom of the contact hole, the inventor, under a transmission electron microscope, analyzed in detail the profile of the sidewall spacers, which had been formed by the second-step etching method as described in the second and third embodiments. Consequently, it was revealed that though the shaving of Si on the flat areas was substantially none, there were local traces of about 50 Å of Si shaving 47 called subtrenches (or trenching) at the lower ends of the sidewalls as shown in FIG. 7.

The detailed generation mechanism of the subtrench 47 has not been known at the moment. However, possible causes are considered to be (1) reflection of ions at the sidewall, (2) orbit changes of incident ions by field distortion in the vicinity of the sidewall, (3) shield effect of polymerized film deposition (protective effect from ion bombardment) in the vicinity of the pattern, and so on.

It was found from analysis that because the SOI film had been substantially reduced in thickness at the subtrench, even if an attempt was made later to form stable $CoSi_2$ suicide, the amount of Si remaining at the subtrench, which was to be consumed by reaction with Co, had been decreased, so that $CoSi_x$ rich in metal and therefore high in resistance was formed. This metal-rich $CoSi_x$ layer is chemically unstable in the neighborhood of the second RTA temperature (normally 750–859° C.) and during the above-mentioned heat treatment, Co liberates itself from $CoSi_x$ and tends to form $CoSi_2$ which has stable surface energy.

The free Co diffuses into the $CoSi_2$ layer or into the Si layer under the sidewall spacers and forms an alloy with Si. At this time, crystal grains grow at the interface of $CoSi_x$ and $CoSi_2$ (in other words, the subtrench 47), thus giving rise to cracks at the interface. As this phenomenon progresses, voids are produced. If a contact hole is open to the voids, a conducting metal may pass from the bottom of the contact hole through the voids, penetrate the BOX layer and reaches the Si substrate. It has been clarified that as with self-aligned contacts, when the hole is open to the gate or the sidewall spacers, chances of penetration through the BOX layer increase in a great measure.

Therefore, to improve the BOX-related yield, it is concluded that it is essential to eliminate the subtrenches 47 (local shaving of Si) at the end portions of the sidewall spacers.

Through etching experiments to form sidewall spacers by using various types of fluorocarbon plasma, the inventor found that the etch rate of $SiO_2$ at the end portions of the sidewall spacers was faster than the etch rate of $SiO_2$ at any other places whatever the etching conditions might be and that the $SiO_2/Si$ selectivity at the end portions was lower than at any other places. However, it has become possible to obtain vertical sidewalls without subtrenches by using a method described in detail below.

By this method, it is possible to form vertical sidewall spacers having no tails, as shown in FIG. 5, without providing any chance of Si shaving, which leads to subtrenches 47. When this process was applied to a real 0.15 μm SOI device, the problem of instability in transistor operation, particularly, in offset current was improved conspicuously.

Description will now be made of an etching method to form sidewall spacers without subtrenches.

As has been described, it was made clear that when the sidewall spacers were etched under a fixed condition, the etch rate at the end portions of the sidewall spacers was faster than any other places and that the $SiO_2$/Si selectivity at the end portions was lower than any other places. The reason for the etch selectivity being low locally at the end portions of the sidewall spacers is considered because the Si layer appears at the end portions of the sidewall spacers, where etching is finished earlier than the flat portion, and therefore oxygen as a reaction product from the $SiO_2$ remaining at the flat portion at this point in time attacks the exposed Si layer and removes the fluorocarbon polymerized film as the etching protective coating for the Si layer. This is considered why local Si shaving occurs, which results in the subtrenches 47, even if the selectivity in the second step is so high as about 500.

To solve this problem, the inventor made an arrangement not to allow the polymerized film to be removed completely even if exposed to attack by oxygen by depositing a thick polymerized film on the Si by exposing the Si to the plasma with ultra-high deposit property for a time from when the SOI layer or Si appeared at the end portions of the sidewall spacers at the beginning of etching in the second step until the sidewall etching was finished completely, in other words, for a while the Si of the SOI layer was subjected to the attack by oxygen at the end portions of the sidewall spacers. The actual etching conditions will be described in the following.

As in the third embodiment described above, the $SiO_2$ film is etched by 1350 Å corresponding to 90% of the total thickness of 1500 Å in a dipole ring type magnetron RIE unit in the first etching step by using a mixed gas of $C_4F_8/O_2$/Ar (their flow rates being 20 sccm/10 sccm/50 sccm, for example) under conditions of a reaction chamber pressure of 40 mTorr and an RF power of 800 W. The remaining portion of the insulating film is etched by 150 Å in the same etching chamber to remove an unnecessary portion except for the sidewall spacers 33 with the extremely high etch selectivity mentioned above.

The second etching step may be carried out at an RF power of 800 W much lower than the 1600 W in the second embodiment under high flow rates of 45 sccm/255 sccm for $CHF_3$/CO and a high pressure of 70 Torr, for example. Under these settings, the silicon oxide/silicon selectivity becomes far higher than 500, so that ultra-high selectivity compared with prior art can be obtained. By using such insulating film/silicon selectivity far higher than 500, vertical sidewalls without subtrenches can be formed.

By evaluating various types of fluorocarbon plasma, the inventor found that kinds of gas suitable for practical use are limited which help obtain the above-mentioned ultra-high selectivity. More specifically, it has been clarified that any of mixed gases of $CHF_3$/CO (the flow rates being 45 sccm/255 sccm) and $CH_2F_2$/CO and $CH_2F_2$/$CHF_3$/CO may be used.

As has been described, in the fourth embodiment, by dividing the etching process of the sidewall spacers into two and by using a mixed gas of $CHF_3$/CO or $CH_2F_2$/CO or $CH_2F_2$/$CHF_3$/CO to thereby obtain an insulating film/silicon selectivity much higher than in prior art, in the second etching step, it has become possible to suppress the subtrenches that used to occur at the end portions of the sidewall spacers, thereby forming vertical sidewall spacers without Si shaving of the SOI layer. By applying this technology to SOI devices, it is possible to notably improve the unfavorable BOX-related yield of SOI devices.

Fifth Embodiment

A fifth embodiment will be described by referring to a case where a silicon nitride film was used for the sidewall spacers shown in the second embodiment.

With the progressive miniaturization of semiconductor elements in recent years, a technology called SAC (self-Aligned Contact) has come into a spotlight.

The SAC structure is a technology by which to form a contact hole self-aligned by a silicon nitride film by forming a silicon nitride film at the top and the side walls of a gate electrode of a transistor.

This silicon nitride film serves as an ion implantation mask when controlling the impurity profile in the channel region in a LDD transistor or in a single drain transistor and therefore control of its width or shape is important in securing operation stability of a transistor. Therefore, in the SAC structure, it is required that sidewall spacers of a silicon nitride film should be formed by etching at such high silicon nitride/silicon selectivity as to reduce a shaving amount of the silicon layer in a SOI substrate and that the width and shape of the sidewall spacers should be controlled with high accuracy.

In this fifth embodiment, after search for etching conditions for forming sidewall spacers with ultra-high silicon nitride film/silicon selectivity, far higher than in prior art, to reduce the shaving of the SOI layer substantially to zero, ultra-high selectivity so high as about 500, which had been regarded as very difficult, was obtained and a practical process condition, that is, a wafer internal uniformity of within ±5% was found, the wafer internal uniformity being an indicator showing the degree of local variation in etching rate in the interior of a wafer.

In an etching process for forming sidewall spacers by a film of silicon nitride, the inventor applied the etching conditions in the first embodiment to the silicon film to build a process with a high selectivity ratio of the silicon nitride film to silicon, in short, a high silicon nitride/silicon selectivity process.

In this case, with regard to the silicon nitride/silicon selectivity, selectivity of not less than 200 could be achieved, but on the other hand, a problem emerged that the in-wafer etch-rate uniformity worsens to a great extent.

Figure 8:
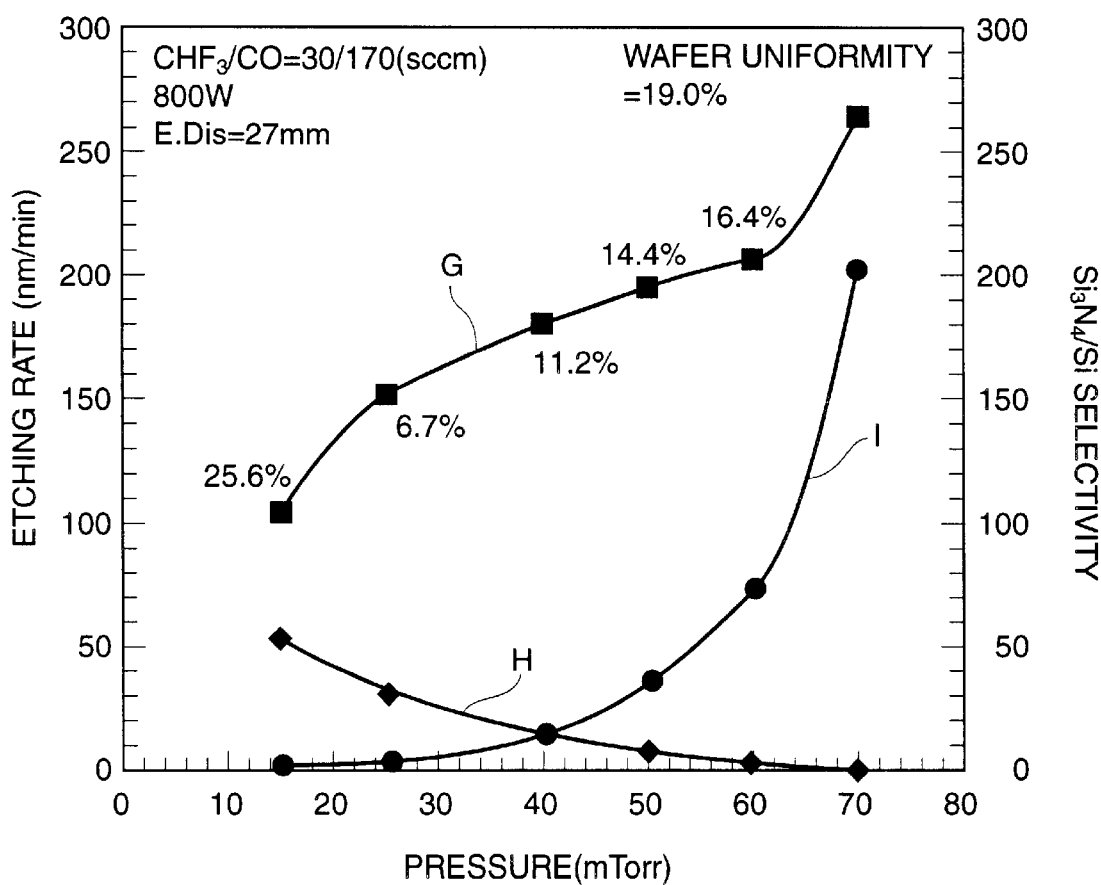
FIG. 8 is a graph showing relations of the etching rates of $Si_3N_4$ and Si and the $Si_3N_4$/Si selectivity with respect to etching gas pressures in a fifth embodiment of the present invention.

As an example, the graph in FIG. 8 shows changes in etching rates of $Si_3N_4$ and Si and changes in $Si_3N_4$/Si selectivity during etching in a dipole ring type magnetron RIE unit when the pressure was varied for a range of 15~70 mTorr under the fixed conditions of flow rates of 30 sccm/170 sccm for $CHF_3$/CO components of a mixed gas, an RF power of 800 W and an electrode spacing of 27 mm.

In FIG. 8, the horizontal axis represents the gas pressures (mTorr) of the mixed gas in the reaction chamber. The vertical axis on the left side represents the etching rates (nm/min) as in FIG. 3 and the vertical axis on the right side represents $Si_3N_4$/Si selectivity.

In FIG. 8, the characteristic curve G shows changes in the etching rate of the silicon nitride film ($Si_3N_4$) when the mixed gas pressure in the reaction chamber was varied, the characteristic curve H shows changes in the etching rate of silicon (Si) when the reaction chamber pressure was varied, and the characteristic curve I shows changes in $Si_3N_4/Si$ selectivity when the reaction chamber pressure was varied.

In addition, the graph shows 19.0%, which is a value of in-wafer etch-rate uniformity (uniformity of a 6-ich wafer) of $Si_3N_4$ subjected to etching at the moment.

As is clear from the graph in FIG. 8, as the mixed gas pressure rises, the etching rate of $Si_3N_4$ increases gradually, but on the contrary, the etching rate of Si decreases, with the result that the $Si_3N_4/Si$ selectivity goes up. This tendency coincides with the changing tendency of the $SiO_2/Si$ selectivity expressed by the characteristic curve F in FIG. 3.

It is understood from the characteristic curve I in FIG. 8 that a high etch selectivity of not less than 200 can be achieved under a high chamber pressure of 70 mTorr. However, unlike in the case of etching the sidewall spacers of silicon oxide, as the chamber pressure rises, the in-wafer etch-rate uniformity gradually deteriorates and reaches 19% at 70 mTorr. A smaller value of in-wafer etch-rate uniformity indicates a smaller variation of etching rate, and therefore indicates better flatness. The in-wafer etch-rate uniformity shows a similar tendency with gas flow rate, more specifically, as the flow rate increases, the $Si_3N_4/Si$ selectivity rises but the in-wafer etch-rate uniformity deteriorates. As described above, it was revealed that, generally, there is a trade-off relation between the $Si_3N_4/Si$ selectivity and the in-wafer etch-rate uniformity and that some technical improvement is required. It has also become clear that there is an optimum pressure for in-wafer etch-rate uniformity and that the in-wafer etch-rate uniformity is minimum at 20~30 mTorr.

Then, the inventor searched for a new kind of gas by which to overcome the trade-off problem between the $Si_3N_4/Si$ selectivity and in-wafer etch-rate uniformity, and found that high in-wafer etch-rate uniformity can be obtained at low pressure and low flow rate when a $CHF_3/CO$ system gas is used, and that the selectivity can be made extremely high without aggravating the uniformity by adding a $CH_2F_2$ gas under the low pressure and low flow rate conditions.

Figure 9:
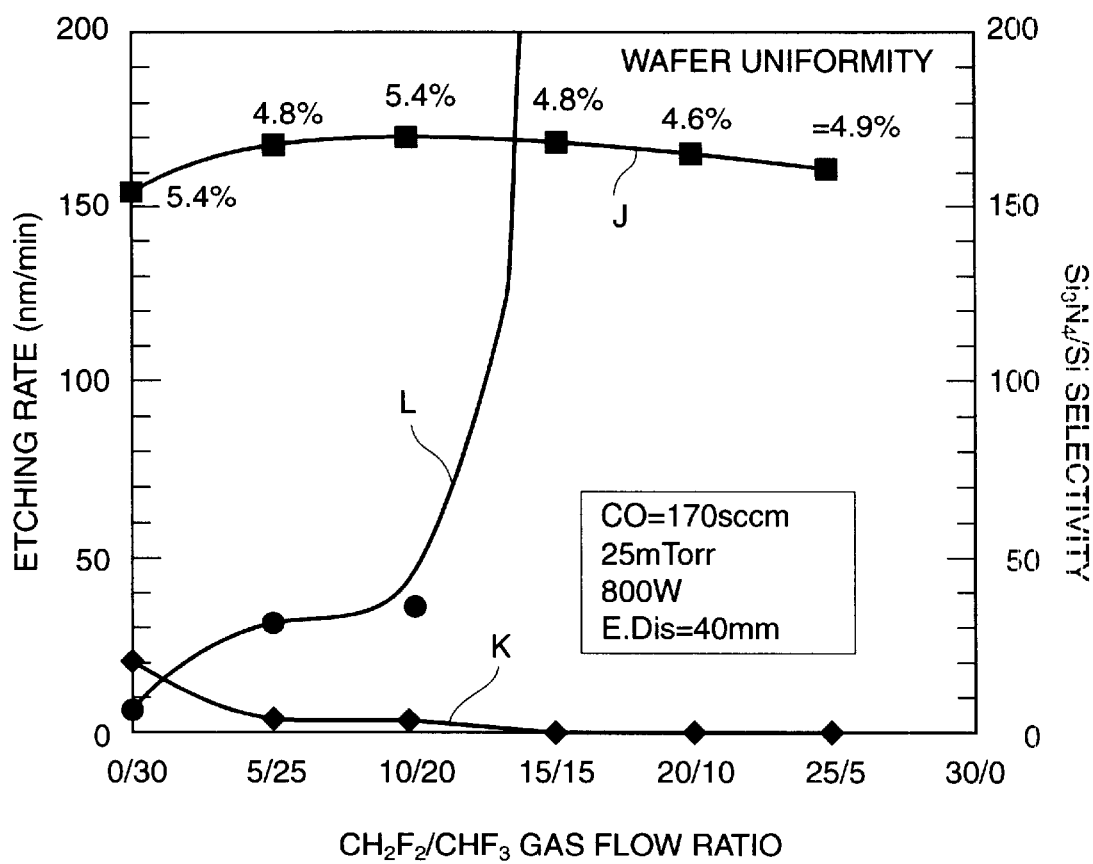
FIG. 9 is a graph showing relations of the etching rates of $Si_3N_4$ and Si and the $Si_3N_4$/Si selectivity with respect to the etching gas flow ratios in the fifth embodiment of the present invention.

FIG. 9 shows changes in etching rates of an $Si_3N_4$ film and an Si film and changes in $Si_3N_4/Si$ selectivity when an $F_3/CH_2F_2$ flow ratios were varied under the fixed conditions of a CO flow rate of 170 sccm and an $F_3/Ch_2F_2$ mixed gas flow rate of 30 sccm, an RF power of 800 W and an electrode spacing of 40 mm.

In FIG. 9, the horizontal axis represents gas flow ratios of $CHF_3/CH_2F_2$ components of a mixed gas in the reaction chamber. The vertical axes on the left and right sides respectively represent the etching rates (nm/min) and the $Si_3N_4/Si$ selectivity as in FIG. 8.

In FIG. 9, the characteristic curve J expresses changes in etching rate of a silicon nitride ($Si_3N_4$) film when the gas flow ratios of $CHF_3/CH_2F_2$ components of a mixed gas in the reaction chamber were varied, the characteristic curve K expresses changes in etching rate of silicon (Si) when the mixed gas flow ratios in the reaction chamber were varied. The characteristic curve L expresses changes in the $Si_3N_4/Si$ selectivity when flow ratios of $CHF_3/CH_2F_2$ components of a mixed gas in the reaction chamber were varied.

In conjunction with the characteristic curve J, the in-wafer etch-rate uniformity representing variation in the etching rate of $Si_3N_4$ at respective gas flow ratios is shown in FIG. 9.

As indicated by the characteristic curve J. as the flow ratio of $CH_2F_2$ rises, the etching rate of $Si_3N_4$ slightly increases, but as indicated by the characteristic curve K, as the flow ratio of $CH_2F_2$ rises, the etching rate of Si decreases. In consequence, the $Si_3N_4/Si$ selectivity increases as indicated by the characteristic curve L. On the other hand, as is clear from the values given in conjunction with the characteristic curve L, each value of the in-wafer etch-rate uniformity does not deteriorates in a large measure but falls within a range of about ±5% despite the increase in the selectivity.

When the flow rates of $CHF_3/CH_2F_2$ components of a mixed gas were 15 sccm/15 sccm, an $Si_3N_4/Si$ selectivity of about 500 and in-wafer etch-rate uniformity of about ±4.8% could be obtained. A practical value of 160 nm/min could be obtained for the etching rate of the $Si_3N_4$ film at this time and the Si shaving amount in over-etching of about 30% as mentioned earlier could be reduced substantially to zero.

As described above, as conditions for etching a silicon nitride film formed on silicon, by making the following settings (1) using a mixed gas of $CHF_3/CH_2F_2/CO$ as an etching gas (2) maintaining the pressure at 20~30 mTorr (3) arranging for a mixing ratio of $CH_2F_2$ in the $CHF_3/CH_2F_2$ gas to be not less than 30% the two problems of the $Si_3N_4/Si$ selectivity and the in-wafer etch-rate uniformity with regard to the etching rate of the $Si_3N_4/Si$ selectivity could be solved. Therefore, it has become possible to obtain an $Si_3N_4/Si$ selectivity of not less than 500 while maintaining uniformity of ±5%.

Sixth Embodiment

Referring to a sixth embodiment, description will be made of a case where the etching conditions described in the fifth embodiment were applied to etching to form sidewall spacers of a MOS transistor.

It was found that under the etching conditions in the fifth embodiment, as described in the second embodiment, the sidewall spacers were tapered (formed with a tail) even when the $Si_3N_4$ film was etched.

This is considered because a $CHF_3/CH_2F_2/CO$ gas with a high deposit property was used as an etching gas for forming sidewall spacers with the intention of attaining ultra-high etch selectivity so large as 500, a polymerized film of CF system was deposited in a thick layer at the bottom portion of the sidewalls of the gate (21, 22) and the polymerized film served as the mask for the sidewalls while etching was taking place. The deposit rate of the polymerized film at the sidewalls is very sensitive to changes in process parameters, such as pressure and temperature. Therefore, if those parameters vary in he interior of a wafer, for example, they are directly conducive to a variation of the taper angle of the tail.

Particularly for a single-drain transistor, the width dimension of the sidewall spacers is a very important parameter in deciding a concentration profile of impurity ions when implanted diagonally. Therefore, on each side of the gate electrode, by the presence of the tail, the sidewall width is made effectively wider than the vertical sidewall spacer by the amount of the tail width. Consequently, when there is a small change in the taper angle of the tail of each sidewall spacer, the implanted dopant concentration profile changes easily, resulting in a variation of a current value of the transistor. It was revealed that if the taper angle varies in a direction in which the taper becomes wider, there is a possibility that an effective sidewall width falls far short of a target value, impurity ions cannot be introduced close to under the gate electrode, and the current value is off a target value. Thus, a conclusion was reached that it is essential to make vertical the walls of the sidewall spacers by removing the tails to stabilize the transistor operation.

The inventor conducted etching experiments to form sidewall spacers by using various types of fluorocarbon plasma, and investigated in detail the relation between silicon nitride/silicon selectivity and the shape of sidewall spacers, and found out that there is a trade-off relation between the realization of high etch selectivity and the realization of vertical walls of sidewall spacers and that even if ultra-high selectivity of about 500 mentioned above could only be achieved, it is virtually impossible to realize vertical sidewall spacers simultaneously with this high selectivity. This is considered chiefly due to a fact that a method was used by which to selectively deposit in a great thickness on silicon a fluorocarbon polymerized film as means to achieve high etch selectivity (because a thick polymerized film, which is responsible for the formation of tails, was also deposited on the walls of the sidewall spacers).

In the sixth embodiment, in the two etching steps of the etching process, the first step and the second step were assigned two different jobs:(I) vertical processing of the sidewall spacers formed of an insulating film of $Si_3N_4$ and (II) securing high $Si_3N_4$/Si selectivity.

An investigation was made into the relation between ratios of the etched-away amounts in steps (I) and (II) out of the total thickness of the silicon nitride film as the object of etching and the shape of the sidewall spacers of silicon nitride ($Si_3N_4$), and it was clarified that in the range of experiment, when the proportion of the etched amount in step (II), a high selectivity step, exceeded 30% of the total thickness to be etched away, the sidewall spacers were formed with a tail.

Therefore, it became evident that it is possible to obtain vertical-walled sidewall spacers while maintaining ultra-high selectivity by limiting the etched amount of $Si_3N_4$ in step (II) to not more than 30% of the thickness of the $Si_3N_4$ film and the etched amount of $Si_3N_4$ in step (I) to not less than 70% of the thickness of the $Si_3N_4$ film.

An embodied process will be described with reference to FIG. 10.

Figure 10A:
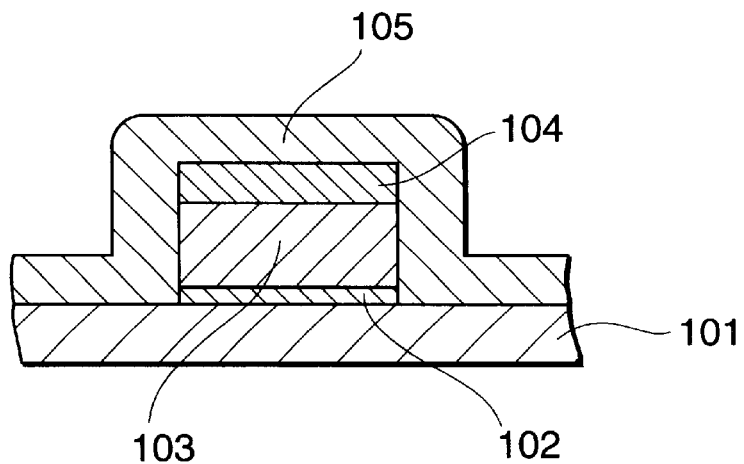
FIGS. 10(a) to 10(c) are sectional views in production steps of an FET according to a sixth embodiment of the present invention.

As shown in FIG. 10(a), after a gate insulating film 102 and a gate electrode film 103 were formed in this order on a silicon film 101 of semiconductor wafer, the gate electrode film 103 and the gate insulating film 102 were etched to form a gate (102 and 103) with a hard mask 104 of $Si_3N_4$. The gate has a height of 200 nm, for example.

The silicon film 101 is a silicon layer of an SOI layer formed on an insulating film in the SOI substrate.

Then, an $Si_3N_4$ film 105 was deposited to a thickness of 500 Å on the whole surface of the semiconductor wafer by an LP-CVD.

Figure 10B:
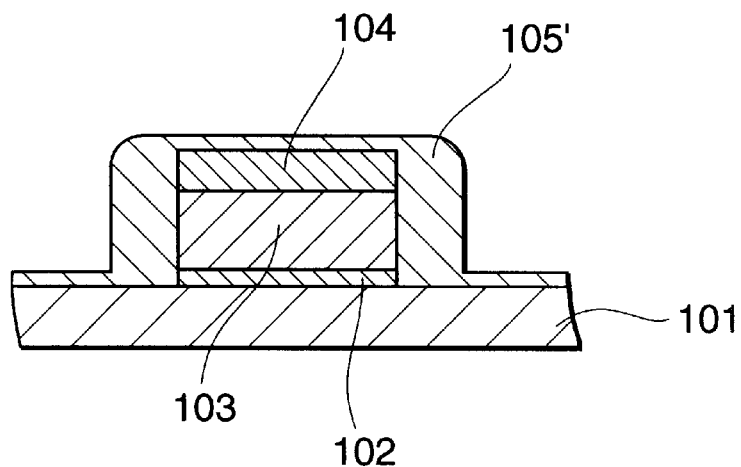

As shown in FIG. 10(b), the $Si_3N_4$ film was etched by 350 Å corresponding to 70% of the total thickness of the film in a dipole ring type magnetron RIE unit at a reaction chamber pressure of 25 mTorr and an RF power of 300 W by using a mixed gas of $CHF_3/O_2/Ar$ (their flow rates being 30 sccm/4 sccm/150 sccm, for example). Under these conditions, the $Si_3N_4$ film 105 was etched such that the sidewalls were substantially vertical.

Though the mixed gas of $CHF_3/O_2/Ar$ was used, a mixed gas of $CHF_3/CH_4/O_2/Ar$ or $CF_4/O_2/Ar$ may be used. By using a mixed gas containing $O_2$, it is possible to suppress an unnecessary deposit effect at the walls of the sidewall spacers.

Figure 10C:
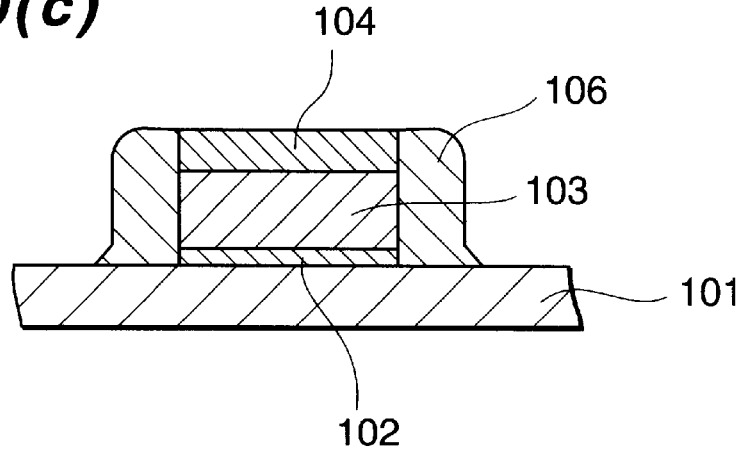

As shown in FIG. 10(c), to remove the unnecessary portion other than the sidewall spacers 106 of the remaining portion 105' of the $Si_3N_4$ film 105, an etching process was carried out on the remaining portion 105' having a thickness of 150 Å (30% of the total thickness of the $Si_3N_4$ film) at a high selectivity ratio as described in the fifth embodiment. For example, the conditions for a high selectivity ratio are that the gas flow rates of the $CHF_3/CH_2F_2/CO$ components of the mixed gas are 15 sccm/15 sccm/179 sccm, an RF power is 800 W, and an electrode spacing is 40 mm. Under these conditions, high selectivity of about 500 could be obtained. The etched amount in the second step was small at not more than 150 Å and therefore the etching time was a few seconds, so that the tail-forming effect by deposition of a polymerized film at the walls of the sidewall spacers 106 were negligible. The first and second etching steps should preferably be continued in the same chamber.

As described above, in the sixth embodiment, an etching process of sidewall spacers of $Si_3N_4$ was divided into a plurality of etching steps and the etching steps were respectively assigned different jobs: (I)vertical processing of the $Si_3N_4$ sidewall spacers and (II) securing the high $Si_3N_4$/Si selectivity. As a result, it has become possible to realize high silicon nitride/silicon selectivity and vertical processing of the sidewall spacers at the same time.

As has been discussed above, according to the present invention, in manufacturing SOI devices, it is possible to form the sidewalls under etching condition at ultra-high selectivity and minimize the amount of shaving of the SOI layer. Further, even if the shaving amount of the SOI layer was minimized, it is possible to provide a field effect transistor with a stable current drive function. Further, even if the shaving amount of the SOI layer was minimized, high yield can be achieved.

Although the foregoing has been a description of the preferred embodiments of manufacturing and etching methods of a field effect transistor according to the present invention, the present invention is not limited to those embodiments and it is will be apparent to those skilled in the art that numerous variations and modifications may be made without departing from the scope of technical ideas set forth in claims and should be construed as belonging to the technical scope of the present invention.

For example, in the embodiments, description has been made of cases where the $SiO_2$ or $Si_3N_4$ film deposited on the gate electrode formed on a SOI substrate was etched, but the present invention is not limited to those embodiments. Even to a case where etching is performed on the $SiO_2$ or $Si_3N_4$ film deposited on the gate electrode formed on an Si bulk substrate, the present invention may be applied and damage to the surface of the Si substrate can be minimized.

What is claimed is:

1. A method for manufacturing a semiconductor device comprising the steps of:

forming a gate electrode on an SOI substrate including silicon;

forming an insulating film on said SOI substrate and said gate electrode;

performing a first etching process to remove said insulating film in an amount corresponding to 70%~90% of a thickness of said insulating film by anisotropic etching of said insulating film; and performing a second etching process to etch a remaining portion of said insulating film by adding a mixed gas including any one of $CHF_3/CO$, $CH_2F_2/CO$ and $CH_2F_2/CHF_3/CO$ to an etching gas, to obtain a higher insulating film/silicon selectivity.

2. A method for manufacturing a semiconductor device according to claim 1, wherein said insulating film is a silicon oxide film.

3. A method for manufacturing a semiconductor device according to claim 2, wherein said second etching step is carried out under a condition of silicon oxide/silicon etch selectivity of not less than 500.

4. A method for manufacturing a semiconductor device according to claim 3, where said first etching step is carried out using a mixed gas of $C_4F_8$ and Ar as a process gas under a condition of a ratio of Ar gas flow rate to a total gas flow rate is not less than 90%.

5. A method for manufacturing a semiconductor device according to claim 1, wherein said first etching step is carried out using a mixed gas including $O_2$ as a process gas.

6. A method for manufacturing a semiconductor device according to claim 5, wherein said mixed gas including $O_2$ is one of a mixed gas of $C_4F_8$, $O_2$ and Ar, a mixed gas of $CHF_3$, $O_2$ and Ar, a mixed gas of $CHF_3$, $CF_4$, $O_2$ and Ar, and a mixed gas of $CF_4$, $O_2$ and Ar.

7. A method for manufacturing a semiconductor device according to claim 1, wherein said first etching step and said second etching step are carried out in the same etching equipment.

8. A method for manufacturing a semiconductor device according to claim 1, wherein said second etching step is carried out using a mixed gas of $CHF_3$ and CO, keeping a total gas flow rate of not less than 300 sccm, and maintaining a total gas pressure at not less than 60 mTorr.

9. A method for manufacturing a semiconductor device according to claim 1, wherein said insulating film is a silicon nitride and said second etching step is carried out under a condition of silicon nitride/silicon etch selectivity of not less than 500.

10. A method for manufacturing a semiconductor device according to claim 1, wherein said second etching step is carried out using a mixed gas of $CHF_3$, $CH_2F_2$, and CO, under a pressure of not less than 20 mTorr and not more than 30 mTorr and under a condition of a mixing ratio of $CH_2F_2$ to a mixed gas of $CHF_3$ and $CH_2F_2$ of not less than 30%.

11. A method for manufacturing a semiconductor device according to claim 1, wherein said first etching step is carried out using a mixed gas including $O_2$ as a process gas.

12. A method for manufacturing a semiconductor device comprising:
    forming a gate electrode on a semiconductor substrate including silicon;
    forming an insulating film on said semiconductor substrate and said gate electrode;
    performing a first etching process to remove said insulating film in an amount corresponding to 70%~90% of a thickness of said insulating film, by anisotropic etching of said insulating film; and
    performing a second etching process to etch a remaining portion of said insulating film under a condition of higher insulating film/silicon selectivity than insulating film/silicon selectivity of said anisotropic etching, said insulating film being a silicon oxide film.

13. A method for manufacturing a semiconductor device according to claim 12, wherein said performing a second etching process is carried out under a condition of silicon oxide/silicon etch selectivity of not less than 500.

14. A method for manufacturing a semiconductor device according to claim 12, where said performing a first etching process is carried out using a mixed gas of $C_4F_8$ and Ar as a process gas, under a condition that a ratio of Ar gas flow rate to a total gas flow rate is not less than 90%.

15. A method for manufacturing a semiconductor device according to claim 12, wherein said performing a first etching process is carried out using a mixed gas including $O_2$ that is one of a mixed gas of $C_4F_8$, $O_2$ and Ar, a mixed gas of $CHF_3$, $O_2$ and Ar, a mixed gas of $CHF_3$, $CF_4$, $O_2$ and Ar, and a mixed gas of $CF_4$, $O_2$ and Ar.

16. A method for manufacturing a semiconductor device according to claim 12, wherein said performing a first etching process and said performing a second etching process are carried out in a same etching equipment.

17. A method for manufacturing a semiconductor device according to claim 12, wherein said performing a second etching process is carried out using a mixed gas of $CHF_3$ and CO, keeping a total gas flow rate of not less than 300 sccm, and maintaining a total gas pressure at not less than 60 mTorr.

18. A method for manufacturing a semiconductor device according to claim 12, wherein said semiconductor substrate is a semiconductor substrate having an insulating layer and a silicon layer formed on said insulating layer, and wherein said gate electrode is formed on said silicon layer.

19. A method for manufacturing a semiconductor device comprising:
    forming a gate electrode on a semiconductor substrate including silicon;
    forming an insulating film on said semiconductor substrate and said gate electrode;
    performing a first etching process to remove said insulating film in an amount corresponding to 70%~90% of a thickness of said insulating film by anisotropic etching of said insulating film; and
    performing a second etching process to etch a remaining portion of said insulating film under a condition of higher insulating film/silicon selectivity than insulating film/silicon selectivity of said anisotropic etching, said performing a first etching process is carried out using a mixed gas including $O_2$ as a process gas.

20. A method for manufacturing a semiconductor device according to claim 19, wherein said performing a first etching process and said performing a second etching process are carried out in a same etching equipment.

21. A method for manufacturing a semiconductor device according to claim 19, wherein said performing a second etching process is carried out using a mixed gas of $CHF_3$ and CO, keeping a total gas flow rate of not less than 300 sccm, and maintaining a total gas pressure at not less than 60 mTorr.

22. A method for manufacturing a semiconductor device according to claim 19, wherein said semiconductor substrate is a semiconductor substrate having an insulating layer and a silicon layer formed on said insulating layer, and wherein said gate electrode is formed on said silicon layer.

* * * * *